US010269758B2

(12) United States Patent
Zou et al.

(10) Patent No.: US 10,269,758 B2
(45) Date of Patent: Apr. 23, 2019

(54) SYSTEMS AND PROCESSES FOR MEASURING THICKNESS VALUES OF SEMICONDUCTOR SUBSTRATES

(71) Applicant: Intel Corporation, Santa Clara, CA (US)

(72) Inventors: Zhihua Zou, Gilbert, AZ (US); Sudip M. Thomas, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/391,551

(22) Filed: Dec. 27, 2016

(65) Prior Publication Data

US 2017/0186722 A1 Jun. 29, 2017

Related U.S. Application Data

(60) Provisional application No. 62/387,421, filed on Dec. 24, 2015.

(51) Int. Cl.
| | |
|---|---|
| *H01L 21/66* | (2006.01) |
| *H01L 23/00* | (2006.01) |
| *G01B 11/26* | (2006.01) |

(52) U.S. Cl.
CPC .............. *H01L 24/81* (2013.01); *G01B 11/26* (2013.01); *H01L 22/12* (2013.01); *H01L 24/75* (2013.01); *H01L 2224/75252* (2013.01); *H01L 2224/75744* (2013.01); *H01L 2224/75753* (2013.01); *H01L 2224/81123* (2013.01); *H01L 2224/81125* (2013.01); *H01L 2224/81203* (2013.01); *H01L 2224/81908* (2013.01)

(58) Field of Classification Search
CPC ..... G01B 11/26; G01B 11/272; G01B 11/306; G01B 11/303; H01L 24/75; H01L 24/81; H01L 2224/75744; H01L 2224/75252; H01L 2224/75753; H01L 2224/81203; H01L 2224/81123; H01L 2224/81125; H01L 22/12
See application file for complete search history.

(56) References Cited

U.S. PATENT DOCUMENTS

| | | | | |
|---|---|---|---|---|
| 5,465,152 A | * | 11/1995 | Bilodeau ............. | G01B 11/306 257/E21.511 |
| 5,621,530 A | * | 4/1997 | Marrable, Jr. ....... | G01B 11/306 257/E21.53 |
| 6,785,005 B2 | * | 8/2004 | Inoue .................. | G03F 7/70725 356/500 |
| 7,362,410 B2 | * | 4/2008 | Kim ..................... | G02F 1/1337 349/189 |

(Continued)

*Primary Examiner* — Michael M Trinh
(74) *Attorney, Agent, or Firm* — Thorpe North & Western, LLP; David W. Osborne (57) ABSTRACT

A system for determining thickness variation values of a semiconductor substrate comprises a substrate vacuumed to a pedestal that defines a reference plane for measuring the substrate. A measurement probe assembly determines substrate CTV and BTV values, and defines a substrate slope angle. A thermal bonding assembly attaches a die to the substrate at a bonding angle congruent with the substrate slope angle. A plurality of substrates are measured using the same reference plane on the pedestal. Associated methods and processes are disclosed.

13 Claims, 5 Drawing Sheets

(56) References Cited

U.S. PATENT DOCUMENTS

| | | | |
|---|---|---|---|
| 7,500,902 B2* | 3/2009 | Nomiya | B24B 37/013 |
| | | | 451/10 |
| 7,714,233 B2* | 5/2010 | Kawamura | H01L 21/4853 |
| | | | 174/260 |
| 7,906,438 B2* | 3/2011 | Koyata | H01L 21/02019 |
| | | | 438/745 |
| 2015/0041524 A1* | 2/2015 | Khanna | B23K 3/087 |
| | | | 228/213 |
| 2017/0154828 A1* | 6/2017 | Gosselin | H01L 22/12 |

* cited by examiner

SYSTEMS AND PROCESSES FOR MEASURING THICKNESS VALUES OF SEMICONDUCTOR SUBSTRATES

PRIORITY DATA

This application claims the benefit of U.S. Provisional Patent Application Ser. No. 62/387,421, filed on Dec. 24, 2015, which is incorporated herein by reference.

TECHNICAL FIELD

Embodiments described herein relate generally to measuring semiconductor substrates during package manufacturing processes.

BACKGROUND

Substrate thickness variations are problematic for a variety of reasons when manufacturing semiconductor packages. For example, substrate warpage can lead to poor contact between electrical connections between a substrate and a die. This can be compounded by the variation in heights of bumps disposed along the top surface of the substrate.

One of the challenges of certain packaging assembly processes (such as thermal compression bonding (TCB) is the characterization of substrate thickness variations. For example, a substrate thickness variation of over 30 micrometers is unacceptable for TCB bonding processes of attaching a die to a substrate because it can result in non-contact-opens or massive bump bridging. Typically, during a TCB process substrate thickness data is measured from substrate edges by a contact micrometer, or by a dual FRT system with two probes that concurrently measure either side of the substrate. However, this process is time consuming and does not address the issues of undesirable substrate thickness variations that cause issues when bonding a die to a substrate.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

DESCRIPTION OF EMBODIMENTS

Before invention embodiments are disclosed and described, it is to be understood that no limitation to the particular structures, process steps, or materials disclosed herein is intended, but that equivalents thereof as would be recognized by those ordinarily skilled in the relevant arts are included herein. It should also be understood that terminology employed herein is used to describe particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" include express support for plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. As used herein, "directly coupled" means that the elements or structures references are in physical contact, and attached to one another. Objects described herein as being "adjacent to" each other may be in physical contact with each other, in close proximity to each other, or in the same general region or area as each other, as appropriate for the context in which the phrase is used.

Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

In one example, a system is disclosed for determining at least one thickness variation value of a semiconductor substrate. The system can comprise a pedestal having a planar support surface and a substrate supported by the planar support surface. A force (e.g., vacuum) can be applied to the substrate via the pedestal to bias the substrate to the planar support surface. A measurement probe assembly can comprise a substrate measurement device configured to facilitate determining at least one thickness variation value of the substrate.

In one example a process is disclosed for determining at least one thickness variation value of a semiconductor substrate. The process can comprise providing a substrate on a planar support surface of a pedestal, and the planar support surface can define a reference plane. The process can comprise applying a force to the substrate via the pedestal to immobilize the substrate. The process can comprise determining at least one thickness variation value of the substrate with a measurement probe assembly.

In one example a method is disclosed for bonding a die to a substrate comprising determining a substrate slope plane of a substrate vacuumed to a pedestal, and bonding a die to the substrate at a bonding plane angle congruent with the substrate slope plane of the substrate.

Figure 1A:
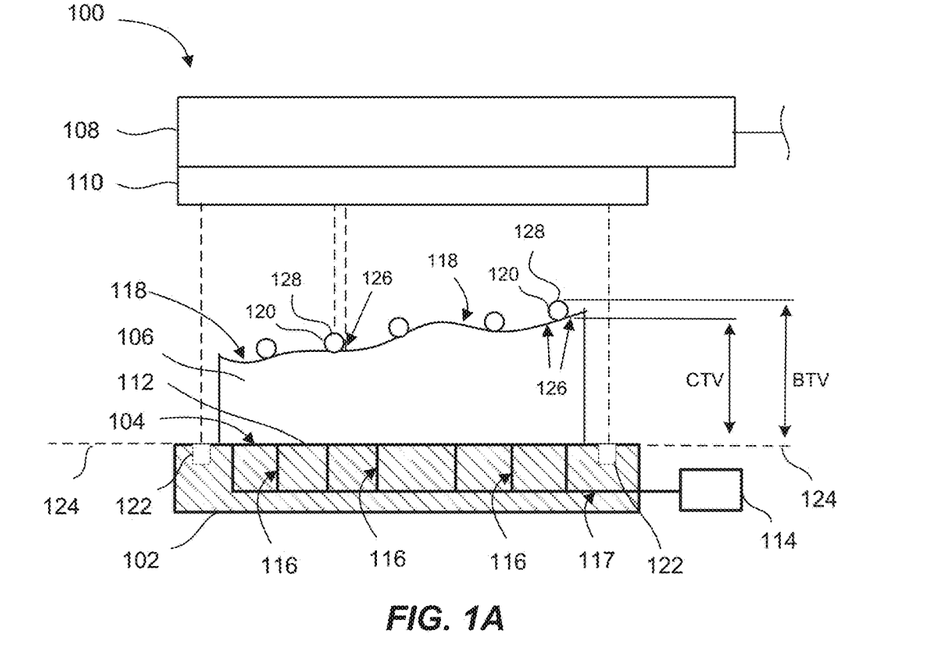
FIG. 1A illustrates an elevation schematic view of a system and process for measuring substrate thickness variation values in accordance with an example.
Figure 1B:
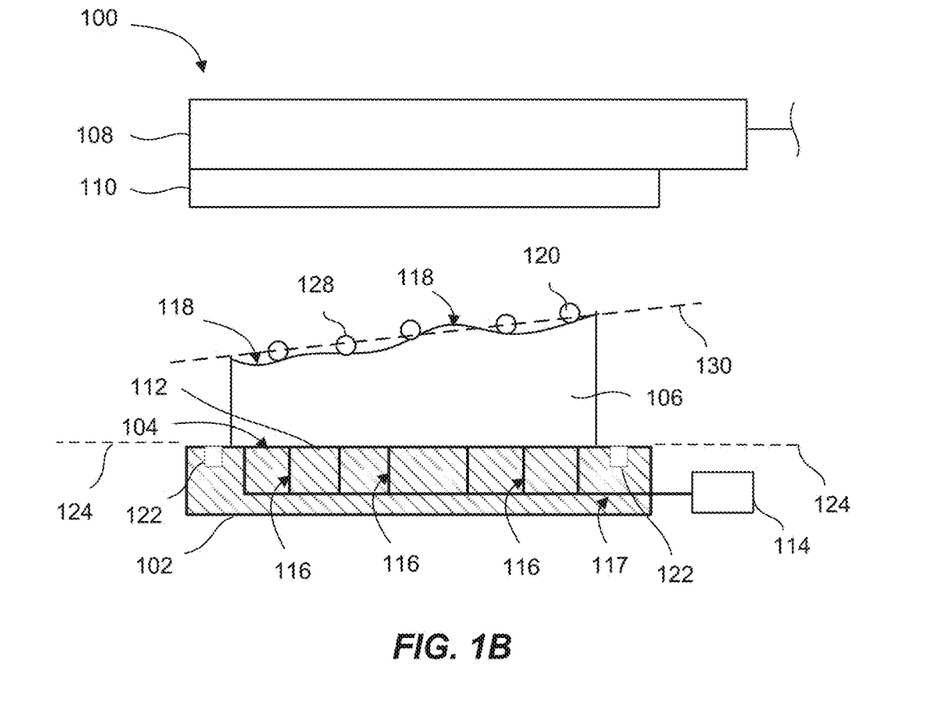
FIG. 1B illustrates an elevation schematic view of a system and process for measuring substrate thickness variation values in accordance with an example.

FIGS. 1A and 1B illustrate a system 100 for determining substrate thickness variations in accordance with an example of the present disclosure. The system 100 can comprise a pedestal 102 having a planar support surface 104 (see e.g., FIG. 3). A substrate 106 is supported by the planar support surface 104, and a force can be applied to the substrate 106 via the pedestal 102 to bias the substrate 102 to the planar support surface 104. The system 100 can include a measurement probe assembly 108 comprising a substrate measurement device 110 configured to facilitate determining at least one thickness variation value of the substrate 102.

More specifically, the pedestal 102 can be comprised of a rigid material, such as an aluminum or stainless steel. The planar support surface 104 can be a very flat support surface, such as a polished metal surface having approximately (or under) 1 micrometer of surface variation. The planar support surface 104 supports a lower surface 112 of the substrate 106. The "force" that can be applied to the substrate 106 via the pedestal 102 can be a vacuum force exerted by a vacuum device 114 that immobilizes the substrate 106 to the planar support surface 104. In one aspect, a plurality of vacuum conduits 116 (only 3 labeled) are formed through the pedestal 102 and fluidly coupled to the vacuum device 114 by a primary conduit 117. The vacuum conduits 116 are each terminated at the planar support surface 104 of the pedestal 102 adjacent the lower surface 112 of the substrate 106. That is, the vacuum conduits 116 assist to "suction down" or generate a vacuum force to the substrate 106. In this manner, the substrate 106 tends to "flatten out" due to the vacuum force (e.g., a vacuum force of −24 in. Hg). The result is that the "natural warpage" of the substrate 106 is reduced or minimized (compared to a non-vacuumed substrate) because the vacuum force tends to flatten the lower surface 112 due to the suction force imparted thereon, which therefore causes an upper surface 118 to flatten as well. Thus, this vacuum force system configuration can reduce or minimize the overall thickness variation of the substrate due to warpage (and bump thickness variations, as discussed below).

The upper surface 118 of the substrate 106 can include a plurality of bumps 120 (only one labeled), such as solder or copper bumps (e.g., Ball Grid Array Balls). These bumps 120 can be formed at positions corresponding to bumps on a die to be bonded thereto (see the below discussion of FIG. 2). For purposes of measuring at least one thickness variation value of the substrate 106, the measurement probe assembly 108 can be part of confocal technology, a Fringe Moire system, or a white light interferometer system, or any suitable measuring system, and can be coupled to a computer system (not shown). The substrate measurement device 110 can be an image sensor(s), such as a 3D imaging sensor like a bump optical inspection device (e.g., part of a white light interferometer system). Being an image sensor, the substrate measurement device 110 can digitally image (in three-dimensional space) at least three reference points 122 to define a reference plane 124 (see also FIG. 2). The reference plane 124 can define a datum point/plane for subsequent substrate measurement processes, as discussed below in some examples. Note that only two reference points 122 are shown on FIGS. 1A-1C, but see FIG. 2 and the discussion below regarding utilizing at least three reference points 122 to determine and define the reference plane 124.

In one example, the substrate measurement device 110 is configured to facilitate measurement of at least one thickness variation of the substrate 106 (i.e., by measuring the topography of top surfaces of the substrate 106). Specifically, the at least one thickness variation of the substrate 106 is derived from substrate thicknesses determined by measured distances between the reference plane 124 and top measurement points of the substrate 106. In one aspect, the measurement probe assembly 108 determines a chip thickness variation (CTV) value of the substrate 106. The top measurement points for the CTV value determination can each comprise a solder resist region 126 associated with a particular bump 120(i) of the plurality of bumps 120 on the substrate 106. The height position of these solder resist regions 126 around each bump 120 are imaged by the substrate measurement device 110 (as illustrated by the dashed line from 110 to solder resist region 126), such as by measuring the topography of the top surface of the substrate using known measurement systems. Each individual bump CTV value at any point along the top surface of the substrate 106 (eg. the solder resist region 126 surrounding the bump 128) can be determined by the relative height of that point normal to the reference plane 124 (z direction). This is referenced on FIG. 1A as arrows for a single CTV. A statistic of multiple bump CTV values for one unit like range or standard deviation can be used to describe the CTV value for that unit. Once measured, in one example the substrate 106 can have a unit CTV value of 20 micrometers, which could be acceptable for continuing TCB die bonding processes, for instance (see the discussion of FIG. 1C below).

Data pertaining to heights of these solder resist regions 126 is transmitted to the measurement probe assembly 108 (having a computer system) for processing. For instance, such "substrate surface height" data can be compared to the position of the reference plane 124 relative to all the solder resist regions 126 along the z-direction. The "machine coordinate systems" of measuring thicknesses with a probe assembly are generally known in the prior art, but it will be appreciated that the probe assembly 108 can be coupled to a computer system having a processor configured to receive and process data (with software) gathered by the image sensor 110 to determine the unit CTV value using a machine coordinate system for each individual solder resist region along the substrate 106.

Similarly, the measurement probe assembly 108 determines a bump thickness variation (BTV) value of the substrate 106. The top measurement points for the BTV value determination can each comprise a top portion 128 of each bump 120 of the plurality of bumps 120 on the substrate 106. The height position of these top portions 128 of each bump 120 are imaged by the substrate measurement device 110 (as illustrated by the dashed line from 110 to top portion 128). Each individual bump BTV value at any point along the tops of the plurality of bumps 120 (e.g., the top portion 128 of any bump 120) can be determined by the relative height of that point normal to the reference plane 124 (z direction). This is referenced on FIG. 1A as arrows for a single BTV. A statistic of multiple bump BTV values for one unit like range or standard deviation can be used to describe the BTV value for that unit. For example, a substrate can have a unit BTV value of 25 micrometers, which could be acceptable for continuing TCB die bonding processes, for instance (see the discussion of FIG. 1C below).

As known in the industry, each bump "i" has a CTV(i) and BTV(i), where BTV(i)=CTV(i)+BH(i) where BH(i) is the bump height for a particular bump. Thus, a unit level CTV is the max−min of all bumps CTV(i), and unit level BTV is the max−min of all bumps BTV(i). Therefore, unit level BTV is a measure of both CTV and BH variation.

Data pertaining to heights of these top portions 128 is transmitted to the measurement probe assembly 108 for processing. For instance, such "bump height" data can be compared to the position of the reference plane 124 relative to all the solder resist regions 126 along the z-direction. Once again, such "machine coordinate systems" of measuring thicknesses with a probe assembly are generally known in the prior art, but it will be appreciated that the probe assembly 108 can be coupled to a computer system having a processor configured to receive and process data (with software) gathered by the image sensor 110 to determine the BTV value using a machine coordinate system for each individual top portion of each bump and for a unit BTV value.

If the CTV value is over a particular threshold lever, then the measured substrate may not be suitable to continue through to another manufacturing process. Thus, the system of FIG. 1A can be used for a variety of purposes related to quality control, quality assurance, production refinement, etc.

In one example, if a CTV value (for a TCB process) is over 30 micrometers, then the substrate may be discarded (i.e., screened-out). Thus, if it is under 30 micrometers, then the substrate may be suitable for a subsequent TCB process to attach a die to the substrate 106.

For example, FIG. 1B illustrates that a next operation (before bonding a die to the substrate) can be the process of determining and defining a substrate plane slope 130 of the substrate 106 by utilizing the measured unit CTV value and BTV value for the substrate 106. This substrate slope plane 130 is the least square plane distance along the substrate 106 corresponding to the measured bump CTV and BTV values. Determining the substrate slope plane 130 assists to maximize desired contact surface with a die (e.g., to minimize non-contact-opens or massive bump bridging). Once the substrate plane slope 130 is determined, a die may be attached or bonded at an angle congruent to with the substrate plane slope 130.

Figure 1C:
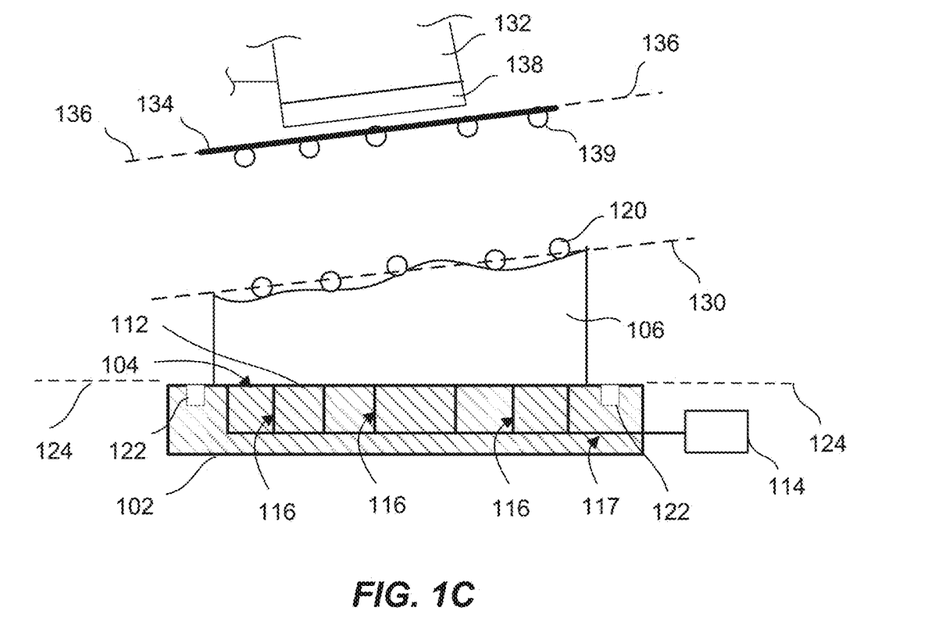
FIG. 1C illustrates an elevation schematic view of a system and process for bonding a die to a substrate in accordance with an example.

For example, FIG. 1C illustrates such process. Here, a die bonding assembly 132 (coupled to a computer system) can be configured to position and attach a die 134 at a bonding plane angle 136 congruent with the substrate plane angle 130 for bonding the die 134 to the substrate 106. In one example, the die bonding assembly 132 can be a TCB assembly having a bond head 138 that vacuums (or otherwise temporarily attaches) the die 134 at the bonding plane angle 136. The die 134 can have a plurality of bumps 139 (only one labeled) that are formed to line-up with respective bumps 120 on the substrate 106. Once the die 134 is biased to the substrate 106 in its desired position by the TCB assembly 132, the bond head 138 thermal bonds the die 134 to the substrate 106. Of course, the die 134 may have its own thickness variations, as well as the bumps 139. Thus, by reducing or minimizing the thickness variation of the substrate 106 vacuumed to the pedestal 102, compounded thickness variations are also reduced when the die 134 is attached to the substrate 106.

Figure 2:
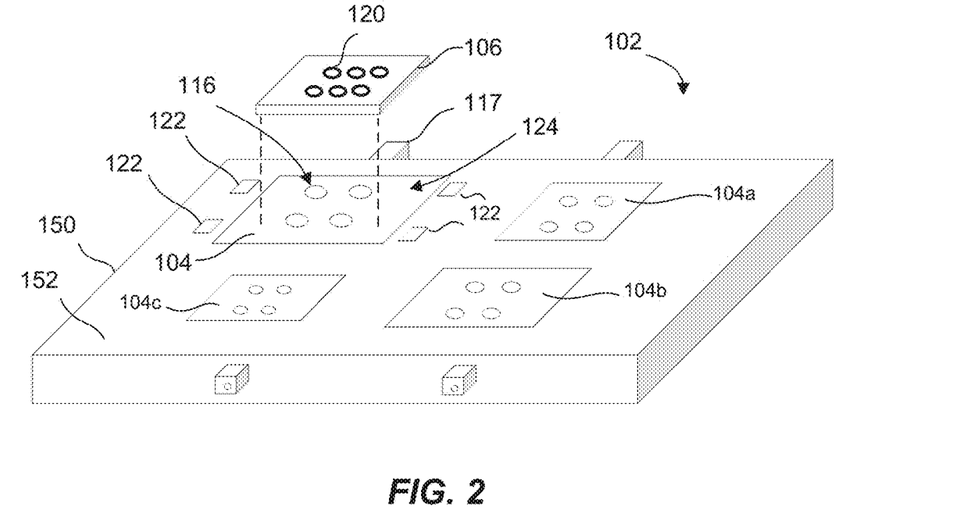
FIG. 2 illustrates a vacuum pedestal in accordance with an example.

FIG. 2 illustrates an example pedestal 102 for measuring substrate thickness of a substrate, such as substrate 106 of FIGS. 1A-1C. The pedestal 102 can comprise a rigid pedestal body 150 and a planar support surface 104 disposed along a plane surface 152 of the rigid pedestal body 150. The planar support surface 104 can define the reference plane 124, as further discussed regarding FIGS. 1A-1C. The planar support surface 152 can have recesses or grooves about the plane surface 152 to evenly distribute the vacuum force to the bottom of the substrate. The plurality of vacuum conduits 116 can be in fluid communication with the primary vacuum conduit 117 coupled to the vacuum device 114, as in FIGS. 1A-1C. Four reference points 112 can be disposed adjacent (or on) the planar support surface 104 for defining the reference plane 124 as measured by a measurement probe assembly, such as the measurement probe assembly 108 of FIGS. 1A-1C. However, three reference points 112 can be used to define the reference plane 124. The reference points 112 can be some form of indicia on or part of the pedestal 102, or they can merely be points about the pedestal around the substrate to define a reference plane. As also discussed above, the vacuum device 114 immobilizes the substrate 106 against the planar support surface 104 for measuring at least one thickness variation value (e.g., CTV and/or BTV) of the substrate 106 relative to the reference plane 124.

As illustrated on FIG. 2, the pedestal 102 can comprise a plurality of planar support surfaces 104*a-c*, each having vacuum conduits (not labeled) coupleable to a vacuum device(s). In one example, each of the plurality of planar support surfaces 104*a-c* can be different sizes relative to each other to accommodate for different sizes of substrates, such as C4 substrates.

In one example, the planar support surface 104 can have a surface variation of less than 1 micrometer, which is very flat relative to the thickness variation of the substrate when not vacuumed to the pedestal 102, for instance. The rigid pedestal body 150 can be comprised of a rigid material, capable of providing an extremely flat and rigid surface, such as a ceramic, a metal, (e.g. an aluminum alloy or other suitable material like stainless steel) that can be machined/polished to have a surface variation of less than 1 micrometer, for instance.

Although FIG. 2 shows the planar support surface 104 as being a larger surface area than the substrate 106, in some examples the planar support surface 104 is smaller than the substrate 106, such as 75 percent of the size of the substrate 106. This can ensure proper suction to the substrate 106 to flatten the substrate 106 as desired.

Notably, once substrate 106 is measured and removed from the pedestal 102, a second substrate can be vacuumed to the same planar surface 104, and then the same reference plane 124 can be used as a datum for the second substrate. This is true for the plurality of planar support surfaces, such that 100 percent of substrates of a production or testing lot can be measured via the pedestal 102 in a very quick and reliable method of screening substrates, as discussed above. In some examples, yet further economy can be attained because of the fact that the original reference plane 124 determination can be used for subsequent substrate measurements and does not need to be re-determined with each new substrate.

Figure 3:
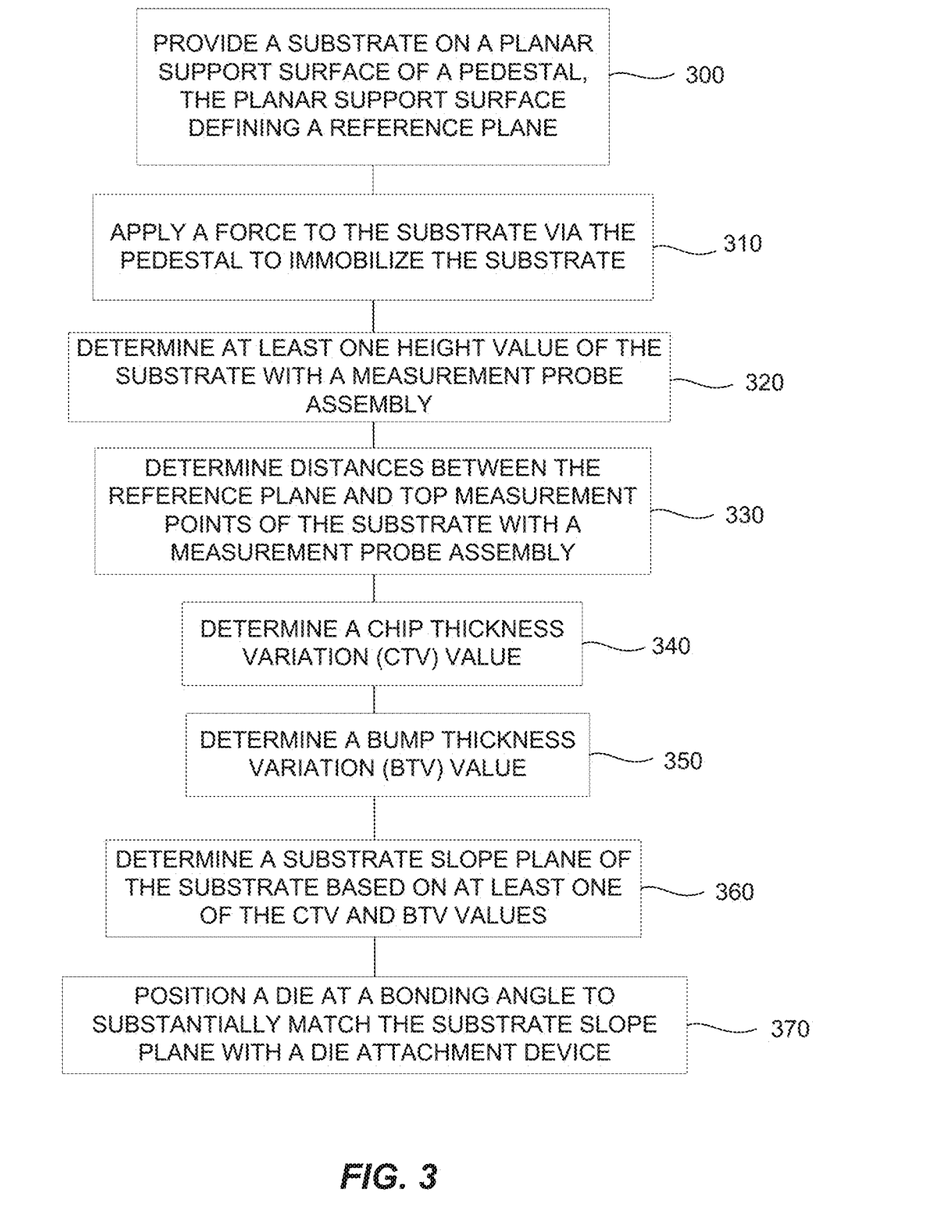
FIG. 3 illustrates a process in accordance with an example.

FIG. 3 illustrates a process for determining at least one thickness variation value of a semiconductor substrate according to one example. The process can comprise operation 300 of providing a substrate on a planar support surface of a pedestal, the planar support surface defining a reference plane (e.g., as described regarding FIGS. 1A-2). The process can comprise operation 310 of applying a force (e.g., vacuum force) to the substrate via the pedestal to immobilize the substrate. The process can comprise operation 320 of determining at least one height value of the substrate with a measurement probe assembly (e.g., 108 of FIGS. 1A-1B). The process can comprise operation 330 of determining distances between the reference plane and top measurement points of the substrate with a measurement probe assembly (e.g., 108 of FIGS. 1A-1B). The process can comprise operation 340 of determining a chip thickness variation (CTV) value, wherein the top measurement points for the CTV value determination each comprise a solder resist region associated with a bump of a plurality of bumps on the substrate (e.g., as described regarding FIGS. 1A and 1B). The process can comprise operation 350 of determining a bump thickness variation (BTV) value, wherein the top measurement points for the BTV value determination each comprise a top of each bump (e.g., as described regarding FIGS. 1A and 1B). The process can comprise operation 360 of determining a substrate slope plane of the substrate based on at least one of the CTV and BTV values (e.g., as described regarding FIG. 1B). The process can comprise operation 370 of positioning a die at a bonding angle to substantially match the substrate slope plane with a die attachment device (e.g., as described regarding FIG. 1C).

Figure 4:
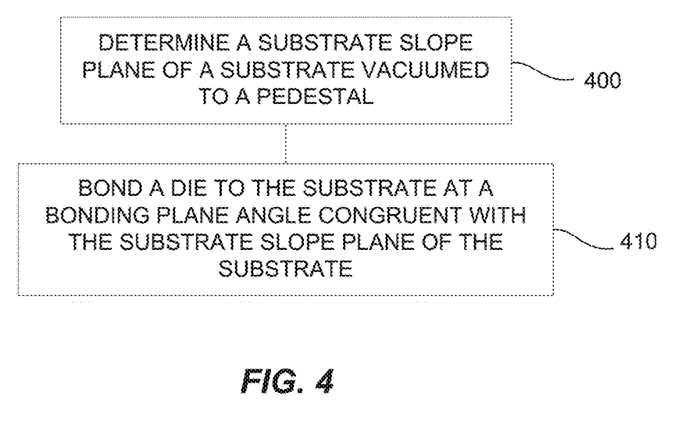
FIG. 4 illustrates a process in accordance with an example.

FIG. 4 illustrates a method of bonding a die to a substrate according to one example of the present disclosure. The process can comprise operation 400 of determining a substrate slope plane of a substrate vacuumed to a pedestal (e.g., as described regarding FIGS. 1A and 1B), and operation 410 of bonding a die to the substrate at a bonding plane angle congruent with the substrate slope plane of the substrate (e.g., as described regarding FIG. 1C).

Figure 5:
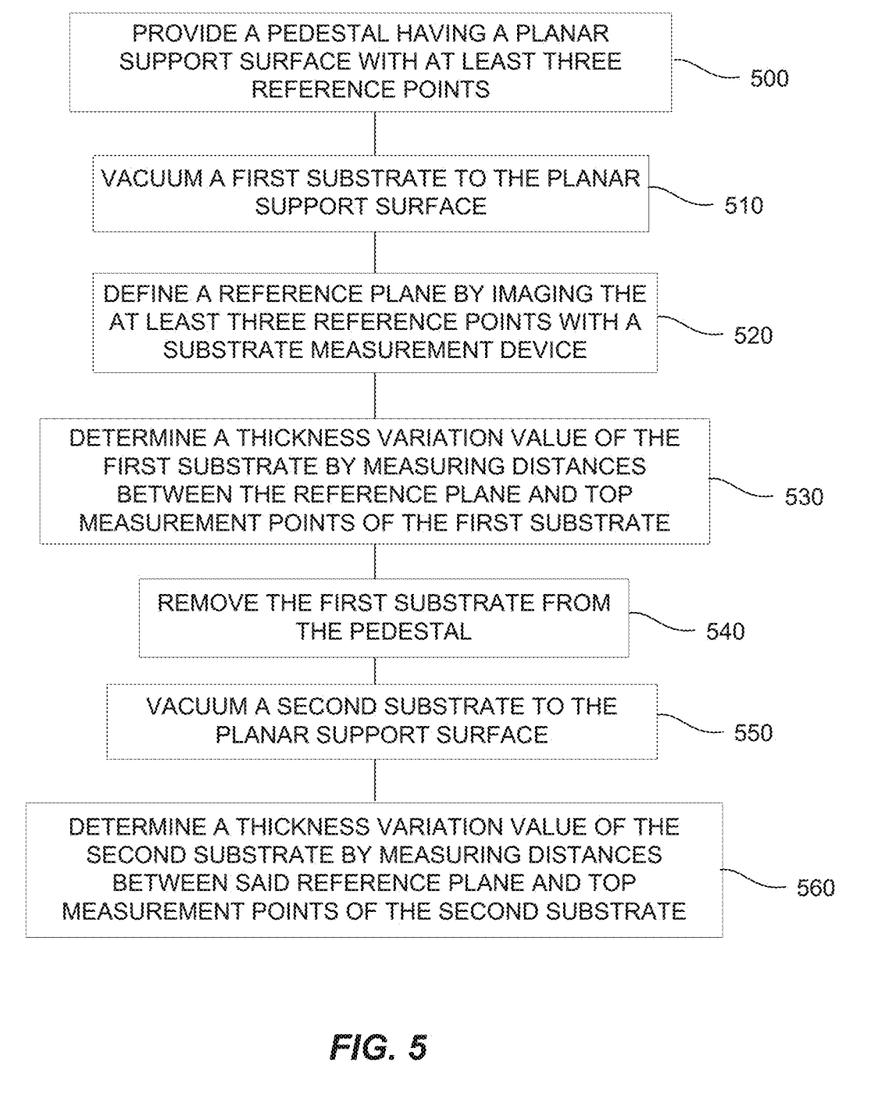
FIG. 5 illustrates a process in accordance with an example.

FIG. 5 illustrates a process of measuring substrate thicknesses variations for a plurality of substrates. The process can comprise operation 500 of providing a pedestal having a planar support surface with at least three reference points (e.g., as described regarding FIGS. 1A-2). The process can comprise operation 510 of vacuuming a first substrate to the planar support surface (e.g., as described regarding FIGS. 1A-2). The process can comprise operation 520 of defining a reference plane by imaging the at least three reference points with a substrate measurement device (e.g., as described regarding FIGS. 1A-2). The process can comprise operation 530 of determining a thickness variation value of the first substrate by measuring distances between the reference plane and top measurement points of the first substrate (e.g., as described regarding FIGS. 1A-2). The process can comprise operation 540 of removing the first substrate from the pedestal (e.g., as described regarding FIG. 2). The process can comprise operation 550 of vacuuming a second substrate to the planar support surface (e.g., as described regarding FIG. 2). The process can comprise operation 560 of determining a thickness variation value of the second substrate by measuring distances between said reference plane and top measurement points of the second substrate (e.g., as described regarding FIG. 2).

Notably, the above example processes can provide a substrate measurement process and TCB bonding process that is about 50-100 times faster than the prior processes and tools without sacrificing accuracy or repeatability (e.g., from 30 minutes to 5 seconds per substrate measurement). This improvement allows screening of 100 percent of substrate units in real-time (as opposed to sampling them). This can dramatically improve yield and manufacturing time and accuracy.

Examples

The following examples pertain to various specific embodiments.

In one example there is provided a system for determining at least one thickness variation value of a semiconductor substrate. The system can comprise: a pedestal having a planar support surface; a substrate supported by the planar support surface, wherein a force is applied to the substrate via the pedestal to bias the substrate to the planar support surface; and a measurement probe assembly comprising a substrate measurement device configured to facilitate determining at least one thickness variation value of the substrate.

In one example, the system comprises a vacuum device fluidly coupled to the pedestal to apply the force to the substrate.

In one example, the substrate measurement device comprises an image sensor and wherein the planar support surface comprises a reference plane, wherein the at least one thickness variation is derived from substrate thicknesses determined by measured distances between the reference plane and top measurement points of the substrate.

In one example, the measurement probe assembly is configured to determine a chip thickness variation (CTV) value, wherein the top measurement points for the CTV value determination each comprise a solder resist region associated with a bump of a plurality of bumps on the substrate.

In one example, the measurement probe assembly is configured to determine a bump thickness variation (BTV) value, wherein the top measurement points for the BTV value determination each comprise a top of each bump.

In one example, the CTV value and the BTV value collectively define a substrate plane slope useable to attach a die at a bonding angle concurrent with the substrate plane slope.

In one example, the measurement probe assembly is configured to measure thickness variation values for each of a plurality of consecutive substrates positionable on the pedestal while using the same reference plane for each consecutive substrate.

In one example, the pedestal comprises a plurality of vacuum conduits to facilitate applying the force to the substrate with a vacuum device about the planar support surface.

In one example, the pedestal comprises a plurality of planar support surfaces that each receive a different substrate to be measured for at least one thickness variation value by the measurement probe assembly.

In one example, at least some of the planar support surfaces of the plurality of planar support surfaces are different sizes to receive different size substrates.

In one example, at least three reference points are disposed about the planar support surface to define the reference plane of the planar support surfaces.

In one example, the planar support surface has a surface variation of less than 1 micrometer.

In one example, the vacuum force is sufficient to at least partially flatten the substrate to minimize substrate warpage.

In one example there is provided a system for attaching a die to a semiconductor substrate. The system can comprise: a vacuum device; a pedestal fluidly coupled to the vacuum device; a substrate vacuumed to the pedestal; a measurement probe assembly comprising a substrate measurement device configured to measure a reference plane of the pedestal and at least one thickness variation of the substrate relative to the reference plane; and a die bonding assembly comprising a bond head configured to attach a die to the substrate at a bonding plane angle substantially congruent to a substrate plane slope of the substrate, wherein the substrate plane slope is determined based on at least one thickness variation.

In one example, the at least one thickness variation comprises a chip thickness variation (CTV) value of the substrate as determined from distances between the reference plane and solder resist regions on the substrate.

In one example, the at least one thickness variation comprises a bump thickness variation (BTV) value of the substrate as determined from distances between the reference plane and tops of bumps on the substrate.

In one example, the measurement probe assembly is configured to measure thickness variation values for each of a plurality of consecutive substrates positionable on the pedestal while using the same reference plane for each consecutive substrate.

In one example, the pedestal comprises a plurality of vacuum conduits to facilitate applying a vacuum force to the substrate with the vacuum device about the planar support surface.

In one example, the pedestal comprises a plurality of planar support surfaces that each receive a different substrate to be measured for at least one thickness variation value by the measurement probe assembly.

In one example, at least some of the planar support surfaces of the plurality of planar support surfaces are different sizes to receive different size substrates.

In one example, at least three reference points are disposed about each of the planar support surfaces to define a reference plane of each planar support surface.

In one example, the planar support surface has a surface variation of less than 1 micrometer.

In one example, the vacuum force is sufficient to at least partially flatten the substrate to minimize substrate warpage.

In one example, the substrate measurement device comprises a bump optical inspection device.

In one example there is provided a process for determining at least one thickness variation value of a semiconductor substrate comprising: providing a substrate on a planar support surface of a pedestal, the planar support surface defining a reference plane; applying a force to the substrate via the pedestal to immobilize the substrate; and determining at least one thickness variation value of the substrate with a measurement probe assembly.

In one example, determining the at least one thickness variation value further comprises determining distances between the reference plane and top measurement points of the substrate with a measurement probe assembly.

In one example, determining the at least one thickness variation value further comprises determining a chip thickness variation (CTV) value, wherein the top measurement points for the CTV value determination each comprise a solder resist region associated with a bump of a plurality of bumps on the substrate.

In one example, determining the at least one thickness variation value further comprises determining a bump thickness variation (BTV) value, wherein the top measurement points for the BTV value determination each comprise a top of each bump.

In one example, the process further comprises determining a substrate slope plane of the substrate based on at least one of the CTV and BTV values.

In one example, the process further comprises positioning a die at a bonding angle to substantially match the substrate slope plane with a die attachment device.

In one example, the die attachment device is a bond head of a thermal compression bonding (TCB) assembly.

In one example, the process further comprises utilizing an image sensor of the measurement probe assembly to facilitate calculation of the CTV and BTV values.

In one example, the process further comprises removing the substrate from the planar support surface, and then immobilizing a supplemental substrate on the planar support surface such that the same reference plane is utilized to measure at least one thickness variation value of the supplemental substrate.

In one example, applying the force comprises applying a vacuum force via a pedestal to a bottom of the substrate to immobilize the substrate before determining the at least one thickness variation value.

In one example, the process further comprises determining the reference plane with a substrate measurement device of the measurement probe assembly by locating at least three reference points on the planar support surface.

In one example, the substrate measurement device comprises a bump optical inspection device.

In one example there is provided a process for determining a substrate slope plane of a substrate comprising obtaining substrate thickness data for the substrate as recited in any of the process examples above, and comparing the substrate thickness data to determine at least one thickness variation value of the substrate.

In one example, the comparison is made by a processor of a computer system with computer readable instructions configured to compare the substrate thickness data.

In one example there is provided a method of bonding a die to a substrate comprising: determining a substrate slope plane of a substrate vacuumed to a pedestal; and bonding a die to the substrate at a bonding plane angle congruent with the substrate slope plane of the substrate.

In one example, determining the substrate slope plane comprises: providing the substrate on a planar support surface of the pedestal, the planar support surface defining a reference plane; applying a force to the substrate via the pedestal to immobilize the substrate; and determining at least one thickness variation value of the substrate with a measurement probe assembly.

In one example, determining the at least one thickness variation value further comprises determining distances between the reference plane and top measurement points of the substrate with a measurement probe assembly.

In one example, determining the at least one thickness variation value further comprises determining a chip thickness variation (CTV) value, wherein the top measurement points for the CTV value determination each comprise a solder resist region associated with a bump of a plurality of bumps on the substrate.

In one example, determining the at least one thickness variation value further comprises determining a bump thickness variation (BTV) value, wherein the top measurement points for the BTV value determination each comprise a top of each bump.

In one example, a thermal compression bonding (TCB) assembly facilitates bonding the die to the substrate with a bond head.

In one example, the process further comprises determining the reference plane with a measurement probe assembly locating at least three reference points on the planar support surface.

In one example, applying the force to the substrate comprises applying a vacuum force about the bottom of the substrate.

In one example, the process further comprises utilizing an image sensor of the measurement probe assembly to assist with determination of the substrate slope plane.

In one example there is provided a process of measuring substrate thicknesses variations for a plurality of substrates comprising: providing a pedestal having a planar support surface with at least three reference points; vacuuming a first substrate to the planar support surface; defining a reference plane by imaging the at least three reference points with a substrate measurement device; determining a thickness variation value of the first substrate by measuring distances between the reference plane and top measurement points of the first substrate; removing the first substrate from the pedestal; vacuuming a second substrate to the planar support surface; and determining a thickness variation value of the second substrate by measuring distances between said reference plane and top measurement points of the second substrate.

In one example, the thickness variation value for each of the first and second substrates includes thickness data comprising a chip thickness variation (CTV) value and a bump thickness variation (BTV) value.

In one example, the process comprises obtaining said thickness data with a measurement probe assembly, wherein the measurement probe assembly comprises an image sensor configured to locate at least three reference points on the planar support surface that define the reference plane.

In one example, the reference plane is used as a substrate measurement reference plane for a plurality of sequentially measured substrates of the plurality of substrates.

In one example, the pedestal comprises a plurality of vacuum conduits to facilitate applying the force to the first and second substrates with a vacuum device.

In one example there is provided a vacuum pedestal for measuring substrate thickness, comprising: a rigid pedestal body; at least one a planar support surface disposed along a plane of the rigid pedestal body and defining a reference plane; at least one vacuum conduit disposed through the rigid pedestal body and fluidly coupleable to a vacuum device, wherein the vacuum device immobilizes a substrate against the at least one planar support surface for measuring a thickness variation value of the substrate relative to the reference plane.

In one example, the vacuum pedestal comprises a plurality of vacuum conduits associated with the at least one planar support surface.

In one example, the at least one planar support surface comprises a plurality of planar support surfaces.

In one example, the plurality of planar support surfaces each receive different sized substrates to be measured for at least one thickness variation value by a measurement probe assembly.

In one example, the vacuum pedestal comprises at least three reference points positioned adjacent the at least one planar support surface to define the reference plane measurable by an image sensor of a measurement probe assembly.

In one example, the at least one planar support surface has a surface variation of less than 1 micrometer.

In one example, the rigid pedestal body is comprised of at least one of aluminum and stainless steel.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. A system for determining at least one thickness variation value of a semiconductor substrate, the system comprising:
   a pedestal having a planar support surface comprising a reference plane defined by at least three reference points, said support surface operable to support a substrate having a bottom surface and a top surface with a plurality of bumps, by engaging the bottom surface with a force sufficient to bias the bottom surface to the planar support surface to flatten the bottom and top surface of the substrate; and
   a measurement probe assembly comprising an image sensor operable to measure distances between the reference plane and the plurality of bumps to facilitate determining at least one thickness variation value of the substrate, the at least one thickness variation value at least partially defining a substrate plane slope of the substrate for bonding a die to the top surface of the substrate at a bonding plane angle concurrent with the substrate plane slope.

2. The system of claim 1, further comprising a vacuum device fluidly coupled to the pedestal to apply the force to the substrate.

3. The system of claim 1, wherein the image sensor comprises a 3D camera to measure a solder resist region of each of the plurality of bumps.

4. The system of claim 3, wherein the measurement probe assembly is configured to determine a chip thickness variation (CTV) value, wherein the top measurement points for the CTV value determination each comprise a solder resist region associated with a bump of the plurality of bumps on the substrate.

5. The system of claim 4, wherein the measurement probe assembly is configured to determine a bump thickness variation (BTV) value, wherein the top measurement points for the BTV value determination each comprise a top of each bump.

6. The system of claim 5, wherein the CTV value and the BTV value collectively define the substrate plane slope useable to attach a die at a bonding angle concurrent with the substrate plane slope.

7. The system of claim 3, wherein the measurement probe assembly is configured to measure thickness variation values for each of a plurality of consecutive substrates positionable on the pedestal while using the same reference plane for each consecutive substrate.

8. The system of claim 1, wherein the pedestal comprises a plurality of vacuum conduits to facilitate applying the force to the substrate with a vacuum device about the planar support surface.

9. The system of claim 8, wherein the pedestal comprises a plurality of planar support surfaces that each receive a different substrate to be measured for at least one thickness variation value by the measurement probe assembly.

10. The system of claim 9, wherein at least some of the planar support surfaces of the plurality of planar support surfaces are different sizes to receive different size substrates.

11. The system of claim 1, wherein the image sensor is operable to image in three-dimensional space the plurality of bumps, the top surface of the substrate, and the at least three reference points.

12. The system of claim 1, wherein the planar support surface has a surface variation of less than 1 micrometer.

13. The system of claim 1, further comprising a die bonding assembly comprising a bond head configured to bond the die to the top surface of the substrate at the bonding plane angle concurrent with the substrate plane slope.

* * * * *